(12) United States Patent
Beyaert et al.

(10) Patent No.: US 6,361,313 B1
(45) Date of Patent: Mar. 26, 2002

(54) LADDER BOAT FOR SUPPORTING WAFERS

(75) Inventors: Olivier Beyaert, Dunkerque; Jean-Pierre Mazur, Videlles; Patrick Raffin, Joinville le Pont; Francis Rodier, Mondeville, all of (FR)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/628,863

(22) Filed: Jul. 28, 2000

(30) Foreign Application Priority Data

Jul. 29, 1999 (EP) .............................................. 99480068

(51) Int. Cl.[7] .............................................. F27D 5/00
(52) U.S. Cl. .................................... 432/259; 211/41.18
(58) Field of Search ................................. 432/253, 258, 432/259; 414/938; 211/41.18; 118/715, 718, 728

(56) References Cited

U.S. PATENT DOCUMENTS

RE26,345 E  *  2/1968  Cummings .................. 432/259
4,504,224 A  *  3/1985  Hewitt ........................ 432/259
6,099,302 A  *  8/2000  Hong et al. .................. 432/259

* cited by examiner

Primary Examiner—Gregory Wilson
(74) Attorney, Agent, or Firm—Margaret A. Pepper

(57) ABSTRACT

The present invention relates generally to an improved ladder boat for supporting semiconductor wafers during thermal treatments which comprises top and bottom plates vertically opposing each other and support rods secured to said plates. Said support rods are provided with dividers for supporting a plurality of wafers one above another in a parallel arrangement. The dividers have a special profile to include a ramp portion so that the wafer is seated at a sharp corner thereof. Therefore, the contact surface between the wafer backside at its periphery and the dividers is segmental or punctual. This contact is preferably performed outside the contact area between the wafer backside and the wafer support zones of the electrostatic chuck of the photolithography tool to be subsequently used in the course of the wafer manufacturing.

12 Claims, 3 Drawing Sheets

LADDER BOAT FOR SUPPORTING WAFERS

FIELD OF THE INVENTION

The present invention relates generally to the manufacture of semiconductor integrated circuits (ICs) and more particularly to an improved ladder boat which supports the semiconductor wafers for processing.

BACKGROUND OF THE INVENTION

Processing of semiconductor wafers (hereinafter called "wafers") includes a number of heat treatments at elevated temperatures to diffuse dopants, to deposit oxide layers and so on. Vertical furnaces are extensively used for conducting heat treatments during so-called "hot" processes which include low pressure chemical vapor deposition (LPCVD), atmospheric oxidation (ATM) and anneal steps. A vertical heat treatment furnace includes a ladder boat to hold the wafers that are disposed horizontally and spaced from another in the vertical direction. The wafers can be automatically loaded and unloaded in and out of the heat treatment furnace by the transfer fork of a robot.

FIG. 1, comprises of FIGS. 1A and 1B, which schematically show the top view and the cross-sectional view (taken along line AA of FIG. 1A) of a conventional ladder boat referenced 10, currently used in standard LPCVD furnaces. It is important to point out that the illustrations are not necessarily drawn to scale. Now turning to FIG. 1, as known for those skilled in the art, the ladder boat 10, comprises a top plate 11A and a bottom plate 11B, vertically opposing each other, six rectangular-shaped support rods 12 (the number can vary between four and six) are provided between the top and bottom plates. Grooves or slots are formed at equal distance in the support rods 12, by a grinding machine as standard that define lodgments to receive the silicon wafers 14. As a result, protrusions commonly referred to as dividers referenced 13, are created and they will support the silicon wafers 14, at their peripheral surface. As apparent in FIG. 1, dividers 13, have the general shape of squared teeth (although rounded teeth are also commonly used in the semiconductor industry). Plates 11A and 11B, are typically made of solar glass, while support rods 12, are made of quartz ware. Wafers 14, are separated in the vertical direction by a distance (labeled P in FIG. 1) referred to as the "pitch" in the technical literature. Typically, the capacity of such a conventional ladder boat is of 160 wafers with a pitch P of about 0.14 inch for a VTR 7000+ reactor (SVG-THERMCO, San Jose, Calif., USA) or 170 wafers with a pitch of 0.2 inch for a TEL ALPHA8 reactor (Tokyo Electron Limited, Tokyo, Japan).

It is important to notice that with this type of ladder boat 10, the contact zone between a wafer 14, and each of the dividers 13, supporting it, is a surface referenced S in FIG. 1, substantially a square in the present case. Typically, the value of contact surface S is about 6 mm². In addition, because the ladder boat 10, is provided with six support rods 12, the total contact surface which is equal to 6×S (i.e. 36 mm²) can be relatively important.

Because monocrystalline silicon (the base material of semiconductor wafers) has a melting point of 1410° C., crystalline defects tend to take place in vicinities of parts of the silicon wafers 14, supported by the support rods 12, at contact surface S, locations during standard heat treatments that are conducted at 1000° C. and above. These defects form the well known "slip lines" or "microscratches" which can be seen either by visual inspection or using magnifying lenses. It is widely admitted in the semiconductor industry that the origin of these microscratches comes from the fact that the wafers are supported at their periphery at a limited number of positions (six in the present case), so that large internal stresses take place in the wafer that are relieved by slip line formation. On the other hand, silicon and quartz particles collectively referred to as chipping particles can be found in vicinities of these contact surface S, locations as a result of mechanical friction.

In addition, each contact surface S, generates a cold zone on the wafer active surface which creates a substantial degradation of the thickness uniformity and contamination, of the deposited layer.

Finally, because LPCVD reactors include a vacuum system, the microscratches and chipping particles generation phenomena is increased by the vibrations caused by the pump. To solve this specific problem of vibrations, different ladder boat designs have been proposed so far. For example, the so-called "ring boat" wherein the wafers are not supported by dividers in grooves of the support rods, rings instead are supported in the grooves and wafers held directly thereon. The peripheral edges of the wafers contact the rings and internal stresses are mitigated, reducing thereby the occurrence of micro-scratches. However, ring boats are difficult to fabricate and rather expensive. Moreover, the contact surface is too important because it is equal to the whole ring surface.

All these drawbacks are also valid for thermal oxidation and anneal steps that are performed at the atmospheric pressure, except the vibrations because no vacuum system is used in this case.

The presence of micro-scratches and chipping particles at the wafer backside is also critical later on in the wafer manufacturing process, because it generates defocused chip images during different photolithography steps (mainly at the deep trench and gate conductor formation) that are subsequently performed. The roughness of the wafer backside surface is locally so modified that it becomes impossible to keep all the wafer in the focus plan of the photolithography tool during its exposition to UV light creating thereby photolithography defects necessitating a rework step as it will be discussed in more details later on. Such a reworking operation substantially increases the wafer processing costs.

In addition, most of photolithography tools are provided with a vacuum operated chuck used to support and firmly hold the wafer during exposure to light. Moreover, the wafer is strongly distorted by the vacuum system to put the entire wafer in the focus plan the most accurately possible. The distortion force is strong enough to crash particles at the wafer backside which sometimes remain on the chuck. In this case, even if we have now to process a wafer having a clean backside, some photolithography defects are created during exposure of the clean wafer by a phenomena of backside cross-contamination. For 300 mm wafer processing, the distortion force applied to them becomes stronger and the probability to let crashed particles on the chuck significantly increases. As a consequence of this contamination, the photolithography tool must be stopped and the specific cleaning procedure recommended by the tool manufacturer is undertaken before the tool becomes operative again in the manufacturing line.

Faced to this acute problem of microscratches and chipping particles, semiconductor manufacturers have developed a number of wafer cleaning procedures that are performed after each LPCVD/ATM process to get a clean wafer backside in order to prevent the contamination of photolithography tool chucks. Currently, the preferred wafer backside cleaning process is done using an AS2000 cleaning tool (Dai Nippon Screen, Kyoto, Japan) which performs an efficient cleaning of both the active and backside faces of the wafer (including the edge) with DI water.

These micro-scratches and chipping particles defects at the wafer backside can induce up to 5% manufacturing yield loss per exposed wafer which is not negligible. Today, they are removed by a step of reworking the wafer to remove the deposited photoresist mask. Such additional operation of reworking which affect the manufacturing line throughput and the photolithography tool up-time is considered as a major problem by the IC manufacturer. As a matter of fact, photolithography is recognized to be certainly one of the most important step in IC manufacturing to date. No doubt that continuous progresses in this field in the last decade have resulted in a greater circuit performance by reducing the dimensions of the devices integrated in the semiconductor wafer.

TABLE I below points out the percentage of reworked wafers as a function of different types of products without and with the above described wafer cleaning process of the prior art.

TABLE I

| Product | Chips per Wafer | Reworked Wafers percentage | |
|---|---|---|---|
| | | No clean. | Cleaning |
| 64 Mbits 0.25 $\mu$m | 330 | 8% | 4% |
| 64 Mbits 0.20 $\mu$m | 440 | 15% | 8% |
| 256 Mbits 0.20 $\mu$m | 144 | 15% | 10% |
| 256 Mbits 0.175 $\mu$m | 300 | 20% | 10% |

As apparent in TABLE I, the more the integration density increases (0.25 $\mu$m to 0.175 $\mu$m), the more the number of reworked wafers increases. On the other hand, the wafer cleaning process only slightly reduces the number of reworked wafers.

With the conventional ladder boat design of FIG. 1, microscratches and chipping particles formation is impossible to avoid as a result of the important contact surface between the silicon wafer and the dividers on the one hand and of vibrations when LPCVD furnaces are used on the other hand. Accordingly, many problems can be expected in the subsequent photolithography steps. As a whole, microscratches and chipping particles are serious detractors of the manufacturing yields, the direct cause of the production of bad chips that are rejected. Therefore, in view of the above, the backside wafer quality becomes a critical parameter of the silicon wafer manufacturing. Ladder boats commercially available to date and wafer cleaning procedures have shown out their limits. Obviously, the mechanical contact between the wafer and the dividers of the ladder boat creates microscratches and chipping particles at wafer backside during wafer loading and unloading operations because the poor handling system accuracy to load wafers in narrow slots (standard wafer pitch is 0.14 inch). Therefore, the solution to the problem raised by microscratches and chipping particles, if any, can only come from an innovative design of the ladder boat.

PURPOSES AND SUMMARY OF THE INVENTION

The present invention is a novel method and an apparatus for the manufacture of semiconductor integrated circuits (ICs) and more particularly relates to an improved ladder boat which supports the semiconductor wafers for processing.

Therefore, one purpose of this invention is to provide an improved ladder boat that significantly reduces the contact surface between the silicon wafer and the dividers.

It is another purpose of the present invention to provide an improved ladder boat that significantly reduces the number of micro-scratches and chipping particles at the wafer backside for increased manufacturing yields.

Yet another purpose of the present invention to provide an improved ladder boat that reduces the cold zones at the wafer active face improving thereby the deposited layer thickness uniformity.

Still another purpose of the present invention to provide an improved ladder boat that reduces the impact of vibrations applied to the silicon wafer when it is processed in a LPCVD furnace.

Still yet another purpose of the present invention to provide an improved ladder boat that reduces the wafer manufacturing cost by eliminating the need of wafer cleaning procedures after each thermal processing step.

Yet another purpose of the present invention to provide an improved ladder boat that significantly reduces the number of microscratches and chipping particles at the wafer backside that has become an essential process parameter with recent advances in photolithography techniques.

Still another purpose of the present invention to provide an improved ladder boat that significantly reduces the number of reworked wafers at the photolithography stage.

Still yet another purpose of the present invention to provide an improved ladder boat that improves the photolithography tool up-time by eliminating the necessity of cleaning the vacuum chuck thereof when contaminated.

Therefore, in one aspect this invention comprises an improved ladder boat for supporting at least one semiconductor wafer for thermal treatment comprising:
 (a) top and bottom plates vertically opposing each other and parallel in a horizontal direction;
 (b) a plurality of support rods secured to said top and bottom plates to define an internal volume therebetween and which are provided with at least one divider to support said wafer,
wherein said wafer divider is profiled to have a ramp portion so that said wafer is seated on a sharp corner thereof.

In another aspect this invention comprises an improved process for forming a ladder boat comprising the steps of:
 (a) forming at least one divider in a support rod, wherein said divider has a ramp shape extending outwardly from said support rod;
 (b) securing at least three of said support rods with said at least one divider to a top plate and a bottom plate, and thereby forming said ladder boat.

According to a significant aspect of the present invention, the contact surface between the wafer backside at its periphery and the dividers is segmental or punctual.

The novel features believed to be characteristic of this invention are set forth in the appended claims. The invention itself, however, as well as other purposes and advantages thereof, may be best understood by reference to the following detailed description of an illustrated preferred embodiment to be read in conjunction with the accompanying drawings.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1A:
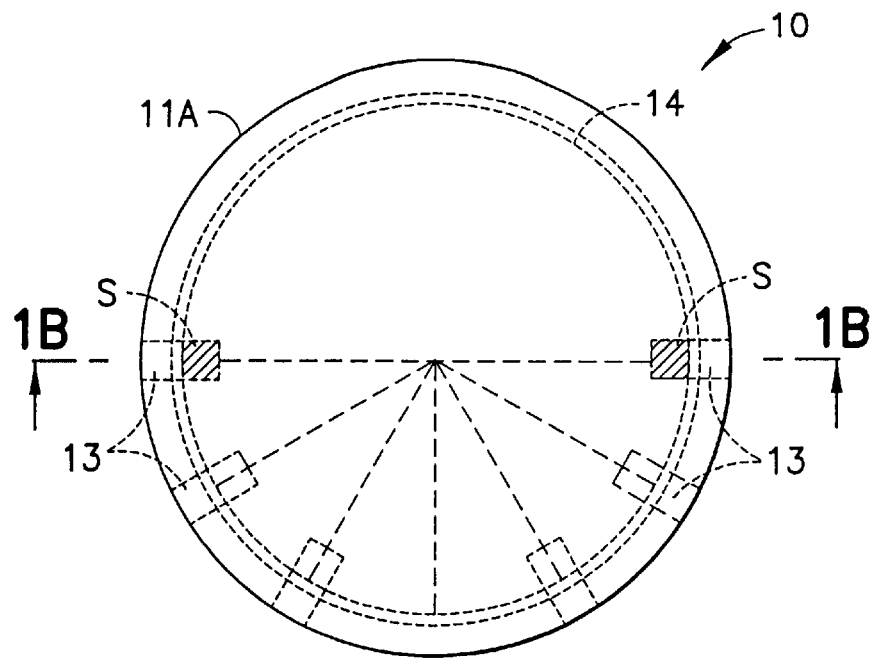
FIG. 1, comprises of FIGS. 1A and 1B, which respectively show a top view and a cross sectional view of a conventional ladder boat.
Figure 1B:
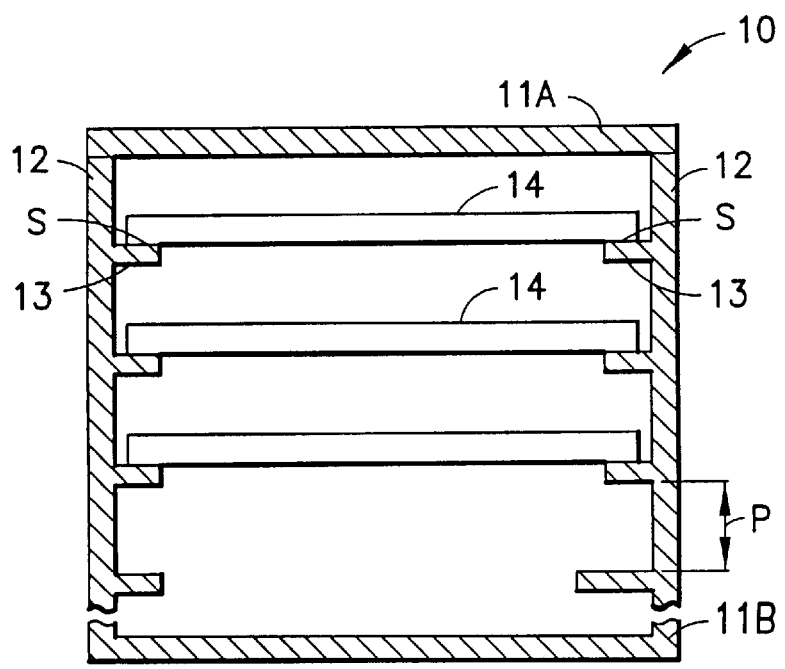

Applicants have observed the quality of the backside of a large a number of wafers after being processed in the LPCVD furnaces of the wafer manufacturing line with the conventional ladder boat of FIG. 1. This observation was performed by a standard beam of oblique light. It was discovered that nicro-scratches and chipping particles were always found at the contact surface S locations and at the close periphery thereof, this could be as a result of the mechanical friction mentioned earlier. However, it was also surprisingly noticed that they were not reproducible batch to batch. The inventors have analyzed and correlated this non-uniformity with the particular structure of the chuck of the photolithography tool.

Figure 2:
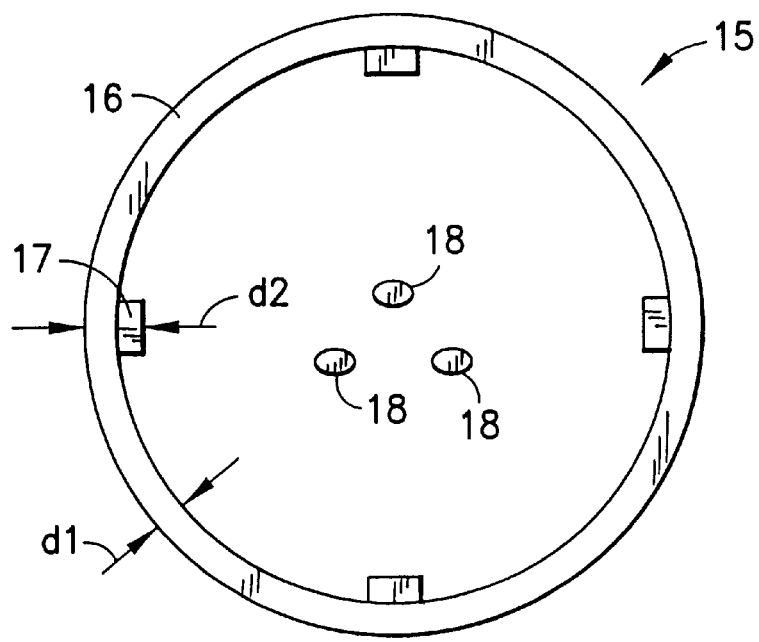
FIG. 2, schematically shows a top view of the electrostatic chuck (the part of the wafer handling system of the photolithography tool) of a Micrascan III.
Figure 3:
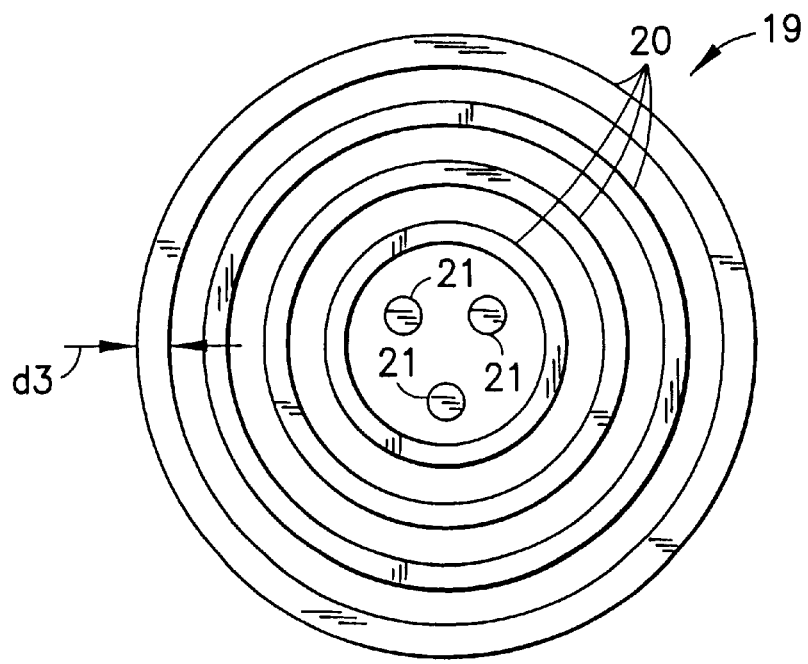
FIG. 3, schematically shows a top view of the electrostatic chuck of a Nikon NSR-2205i12.

FIGS. 2 and 3, illustrate two different chuck designs which are commercially available photolithography tools.

Now turning to FIG. 2, the chuck 15 of the Micrascan III, a tool sold by SVG Lithography Systems, Wilton, Conn., USA, is characterized by the presence of an external ring 16, that is provided with four extensions 17, and three central pads 18. The ring 16, has a width d1 which is equal to 2 mm at the ring circumference, except that at the four extension locations where the total width d2 is equal to 5 mm.

The chuck 19, shown in FIG. 3, is a part of the Nikon NSR-2205i12, a photolithography tool sold by Nikon Corp., Tokyo, Japan, which has a different structure. It is comprised of a plurality of annular rings 20, . . . having a width of 2 mm and of three central pads 21, disposed according to an equilateral triangle.

In both cases, the wafer thus seats down on at least one ring (16 or 20, . . . ) and on a few central pads (18 or 21) depending the chuck (15 or 19) in consideration. The inventors have observed that the areas of the silicon wafer that are common to both contact surface S locations and the rings are the exact zones where they found the maximum of micro-scratches and chipping particles.

Therefore, the inventors have invented an improved ladder boat that reduces the number of micro-scratches and chipping particles which can be even further optimized when the photolithography tool chuck design is taken into consideration.

Figure 4A:
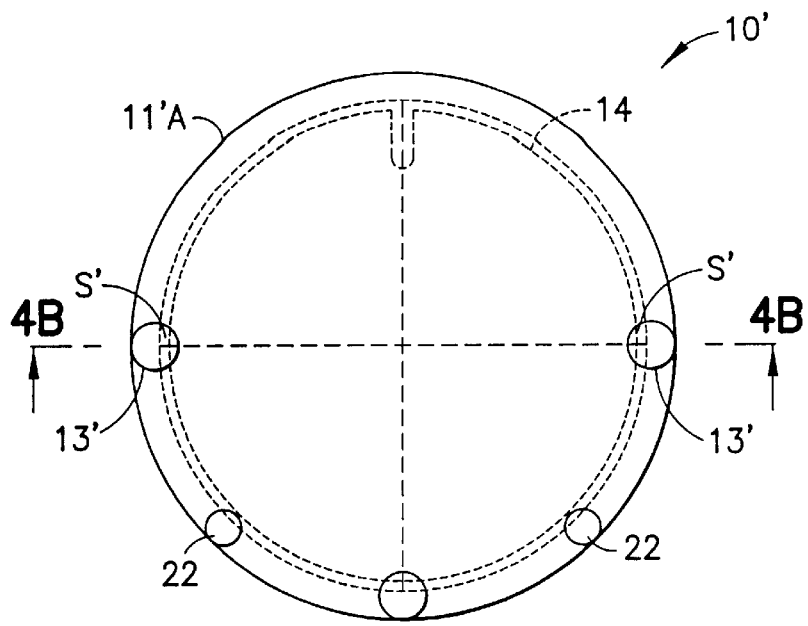
FIG. 4, comprises of FIGS. 4A and 4B, which respectively show a top view and a cross sectional view of the improved ladder boat of the present invention.
Figure 4B:
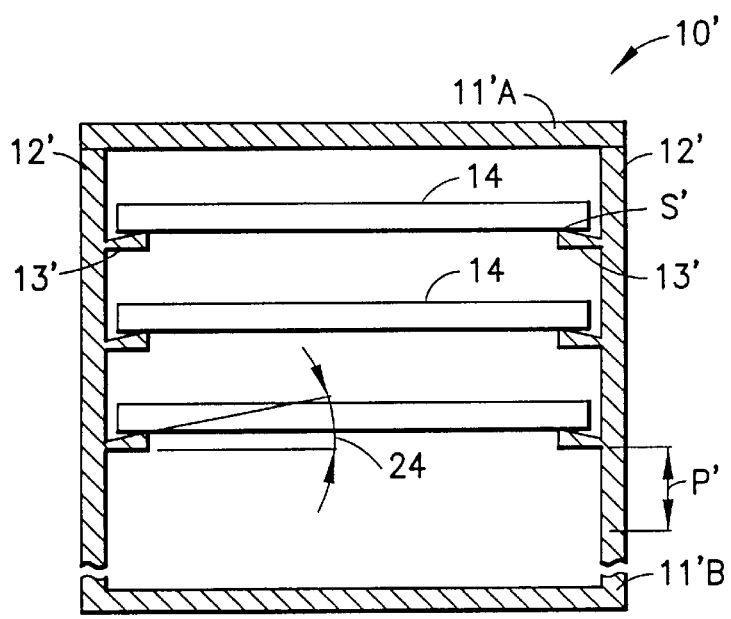
Figure 5:
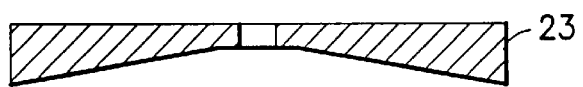
FIG. 5, shows a cross-section of a saw blade having a particular profile that can be used to machine the support rods according to the present invention.

The improved ladder boat of the present invention illustrated in FIG. 4, comprises of FIGS. 4A and 4B, which respectively show a top view and a cross sectional view thereof. Like reference numerals (with prime) are now used in this drawing to designate identical (corresponding) parts. Now turning to FIG. 4, the main originality of the improved ladder boat now referenced 10', is to ensure that the contact between the wafer backside and a divider is limited to a segmental or punctual or supporting surface S' having a significantly lower value than the corresponding contact surface S. As apparent in FIG. 4, the new divider now referenced 13', includes a ramp portion so that a silicon wafer 14, is seated at a sharp corner thereof to minimize said contact surface S'. This particular shape can be obtained by forming slots in support rods 12', using a standard grinding machine but with a tilted saw blade and moving the rod step by step until all the slots are formed and then assembling the support rods 12', with the top and bottom plates 11'A and 11'B, to fabricate the improved ladder boat 10'. However, the improved ladder boat can be fabricated another way. The top and bottom plates are assembled with support rods 12', not yet machined. Normal slots are first produced in the support rods using a standard grinding machine that is mounted inside the internal volume defined by the plates and the support rods. Then, using a set of saw blades having a special profile, such as the saw blade 23, shown in FIG. 5, the grooves are simultaneously machined again. The saw blades are inserted at the bottom of the slots and then moved downwards while still rotating to create the ramp portion mentioned above with the desired angle. As apparent in FIGS. 4 and 5, the angle defining the saw blade profile determines the ramp portion profile.

In a particular implementation, the length of the divider 13' is equal to 12 mm and the angle 24 of the ramp with the horizontal direction is about 3°. The value of angle 24 which depends of the pitch P' must be greater than zero and preferably greater than 2°. In this implementation S' is equal to 1 mm².

Another significant feature is the number of support rods 12', is now limited to three which suffice to define a plane to support the wafer. As apparent in FIG. 4, these three support rods 12', preferably have a circular section and thus are glass cylinders (other shapes derived from this cylindrical shape can be envisioned as well). Support rods can be placed as shown in FIG. 4. This reduced number of support rods in turn not only reduces the contact surface but also the detrimental influence of the vibrations produced during LPCVD steps. Two additional rods 22, can also be secured to the top and bottom plates to improve the overall ladder boat rigidity. These two additional rods 22, can be worthwhile especially during either high temperature treatments or during LPCVD steps because in this case they allow the reduction of the contact surface S'.

As a final consequence, the contact surface is two fold reduced. It first is minimized to substantially a segmental or a punctual surface (represented by S') and by the reduction of the number of supports rods to only three instead of six in the conventional ladder boat 10, of FIG. 1. As a result the total contact surface is now represented by 3×S', i.e. 3 mm² (as compared to 36 mm²). This contact surface reduction is an essential aspect in the attempt to reduce the number of micro-scratches and chipping particles, and the cold zones at the active face of the wafer to improve deposited layer thickness uniformity.

Still another important feature of ladder boat 10', is that this segmental or punctual contact is preferably performed outside the contact area between the wafer backside and the photolithography chuck. In other words, whenever possible any mechanical contact between the zones of the wafer that have been in contact with the dividers during the thermal steps and the zones of the chuck supporting the wafer during photolithography steps should be avoided.

The rework rate (percentage of reworked wafers) is given below in TABLE II for the same products as listed in TABLE I. However, it should also be noted that in this case, the wafer cleaning process mentioned above has not been performed because it is no longer necessary. The backside wafer is clean enough to be directly processed in the photolithography tool without causing any contamination to the chuck.

TABLE II

| Product | Reworked wafers percentage |
| --- | --- |
| 64 Mbits 0.25 μm | 0 % |
| 64 Mbits 0.20 μm | 1–2 % |
| 256 Mbits 0.20 μm | 2–4 % |
| 256 Mbits 0.175 μm | 5 % |

The improved ladder boat 10', has found extensive applications in the silicon wafer manufacturing, in particular for the deposition of the thin $SiO_2$ or $Si_3N_4$ pad and capping layers. Other designs of the improved ladder boat 10', can be envisioned as far as they respect the general rules stated above. It will be apparent to those skilled in the art that various modifications in the design of the dividers and of the ladder boat described above by reference to FIG. 4, may be made without departing from the spirit or scope of the present invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A ladder boat for supporting at least one semiconductor wafer for thermal treatment comprising:

(a) top and bottom plates vertically opposing each other and parallel in a horizontal direction;

(b) a plurality of support rods secured to said top and bottom plates to define an internal volume therebetween and which are provided with at least one divider to support said wafer, wherein said wafer divider is profiled to have a ramp portion so that said wafer is seated on a sharp corner thereof, the contact surface being limited to a segment of line disposed on a circle that is concentric to said wafer periphery and is spaced therefrom to avoid microscratches and chipping particles during said thermal treatments.

2. The ladder boat of claim 1, wherein contact surface between said wafer backside at its periphery and said divider is segmental or punctual.

3. The ladder boat of claim 1, wherein angle of said ramp in the horizontal direction is greater than about 2°.

4. A ladder boat for supporting at least one semiconductor wafer for thermal treatment comprising:

(a) top and bottom plates vertically opposing each other and parallel in a horizontal direction;

(b) a plurality of support rods secured to said top and bottom plates to define an internal volume therebetween and which are provided with at least one divider to support said wafer, wherein said wafer divider is profiled to have a ramp portion so that said wafer is seated on a sharp corner thereof, wherein said angle of said ramp in the horizontal direction is about 3°.

5. The ladder boat of claim 1, wherein at least three support rods support said wafer so that said wafer is supported at only three points.

6. The ladder boat of claim 1, wherein at least three support rods support said wafer so that said wafer is supported at only three points, and wherein said points are separated by an angle of 90°.

7. The ladder boat of claim 1, wherein cross-sectional area for said support rods is selected from a group consisting of a circular area, rectangular area, square area, elliptical area and triangular area.

8. The ladder boat of claim 1, wherein cross-sectional area for said divider is selected from a group consisting of a circular area, rectangular area, square area, elliptical area and triangular area.

9. The ladder boat of claim 1, wherein cross-sectional area of said wafer divider is minimum at the contact junction with said support rod.

10. The ladder boat of claim 1, further comprising at least two additional rods which are not provided with dividers to improve rigidity thereof.

11. The ladder boat of claim 1, further comprising at least two additional rods which are not provided with dividers to improve rigidity thereof, and wherein each additional rod being placed between two support rods.

12. A ladder boat for supporting at least one semiconductor wafer for thermal treatment comprising:

(a) top and bottom plates vertically opposing each other and parallel in a horizontal direction;

(b) a plurality of support rods secured to said top and bottom plates to define an internal volume therebetween and which are provided with at least one divider to support said wafer, wherein said wafer divider is profiled to have a ramp portion so that said wafer is seated on a sharp corner thereof, and wherein contact surface between said wafer backside at its periphery and said divider is segmental or punctual, and wherein said segmental or punctual contact is performed outside the contact area between the wafer backside and the wafer support zones of an electrostatic chuck of a photolithography tool to be subsequently used in the course of wafer manufacturing.

* * * * *